(12) United States Patent
Watchko et al.

(10) Patent No.: US 6,965,071 B2
(45) Date of Patent: Nov. 15, 2005

(54) THERMAL-SPRAYED METALLIC CONFORMAL COATINGS USED AS HEAT SPREADERS

(75) Inventors: George R. Watchko, Stoneham, MA (US); Matthew T. Gagnon, Topsfield, MA (US); Peter W. Liu, Malden, MA (US); Miksa de Sorgo, Windham, NH (US); Christian V. Rodriguez, Lawrence, MA (US); William G. Lionetta, Winchester, MA (US); Scott M. Oppenheim, Groton, MA (US)

(73) Assignee: Parker-Hannifin Corporation, Cleveland, OH (US)

( * ) Notice: Subject to any disclaimer, the term of this patent is extended or adjusted under 35 U.S.C. 154(b) by 49 days.

(21) Appl. No.: 10/287,490

(22) Filed: Nov. 1, 2002

(65) Prior Publication Data

US 2003/0066672 A1 Apr. 10, 2003

Related U.S. Application Data

(63) Continuation-in-part of application No. 10/137,229, filed on May 1, 2002, now Pat. No. 6,763,576.
(60) Provisional application No. 60/289,920, filed on May 10, 2001.

(51) Int. Cl.[7] .................................................. H05K 9/00
(52) U.S. Cl. ................................ 174/35 GC; 361/718; 174/35 MS
(58) Field of Search ......................... 174/35 R, 35 MS, 174/35 GC; 361/816, 818, 718

(56) References Cited

U.S. PATENT DOCUMENTS

| | | |
|---|---|---|
| 3,758,123 A | 9/1973 | Keieaki |
| 3,928,907 A | 12/1975 | Chisholm |
| 4,299,715 A | 11/1981 | Whitfield et al. |
| 4,466,483 A | 8/1984 | Whitfield et al. |
| 4,473,113 A | 9/1984 | Whitfield et al. |
| 4,606,962 A | 8/1986 | Reylek et al. |
| 4,654,764 A | 3/1987 | Hsiao |
| 4,685,987 A | 8/1987 | Fick |
| 4,764,845 A | 8/1988 | Artus |
| 4,782,893 A | 11/1988 | Thomas |

(Continued)

OTHER PUBLICATIONS

Severinsen, J., "Gaskets That Block EMI," Machine Design, vol. 47, No. 19, pp. 74–77 (Aug. 7, 1975).

Ecoplate™ Metallic Conformal Coating Process (Feb. 2002).

Hannafin, J., A Novel Apporach to Thermal Management and EMI Shielding Via a Metallic Conformal Coating on a Plastic Housing (May 2002).

Chomerics EMI Shielding Laminates. Applicants request the Examiner to consider this reference as prior art under 102(a), however, Applications respectfully reserve the right to supplement this Information Disclosure Statement and take a contrary position should it be necessary.

Chomerics CHO–Shield Conductive Coatings. Applicants request the Examiner to consider this reference as prior art under 102(a), however, Applicants respectfully reserve the right to supplement this Information Disclosure Statement and take a contrary position should it be necessary.

(Continued)

*Primary Examiner*—Hung V. Ngo
(74) *Attorney, Agent, or Firm*—John A. Molnar, Jr.

(57) ABSTRACT

Heat dissipation and electromagnetic interference (EMI) shielding for an electronic device having an enclosure. An interior surface of the enclosure is covered with a conformal metallic layer which, as disposed in thermal adjacency with one or more heat-generating electronic components or other sources contained within the enclosure, may provide both thermal dissipation and EMI shielding for the device. The layer may be sprayed onto the interior surface in a molten state and solidified to form a self-adherent coating.

28 Claims, 5 Drawing Sheets

U.S. PATENT DOCUMENTS

| | | |
|---|---|---|
| 4,842,911 A | 6/1989 | Fick |
| 4,869,954 A | 9/1989 | Squitieri |
| 4,965,699 A | 10/1990 | Jorden et al. |
| 4,968,854 A | 11/1990 | Benn, Sr. et al. |
| 4,974,119 A | 11/1990 | Martin |
| 4,979,074 A | 12/1990 | Morley et al. |
| 4,988,550 A | 1/1991 | Keyser et al. |
| 5,060,114 A | 10/1991 | Feinberg et al. |
| 5,068,493 A | 11/1991 | Benn, Sr. et al. |
| 5,107,070 A | 4/1992 | Benn, Sr. et al. |
| 5,115,104 A | 5/1992 | Bunyan |
| 5,137,959 A | 8/1992 | Block et al. |
| 5,151,777 A | 9/1992 | Akin et al. |
| 5,167,851 A | 12/1992 | Jamison et al. |
| 5,194,480 A | 3/1993 | Block et al. |
| 5,213,868 A | 5/1993 | Liberty et al. |
| 5,250,209 A | 10/1993 | Jamison et al. |
| 5,298,791 A | 3/1994 | Liberty et al. |
| 5,309,320 A | 5/1994 | Smith |
| 5,321,582 A | 6/1994 | Casperson |
| 5,359,768 A | 11/1994 | Haley |
| 5,438,423 A | 8/1995 | Lynch et al. |
| 5,471,027 A | 11/1995 | Call et al. |
| 5,510,174 A | 4/1996 | Litman |
| 5,512,709 A | 4/1996 | Jencks et al. |
| 5,522,602 A | 6/1996 | Kaplo et al. |
| 5,524,908 A | 6/1996 | Reis |
| 5,533,256 A | 7/1996 | Call et al. |
| 5,545,473 A | 8/1996 | Ameen et al. |
| 5,566,055 A * | 10/1996 | Salvi, Jr. .................... 361/816 |
| 5,603,514 A | 2/1997 | Jencko et al. |
| 5,679,457 A | 10/1997 | Bergerson |
| 5,766,740 A | 6/1998 | Olson |
| 5,798,171 A | 8/1998 | Olson |
| 5,811,050 A * | 9/1998 | Gabower .................... 264/299 |
| 6,049,469 A | 4/2000 | Hood, III et al. |
| 6,054,918 A | 4/2000 | Hoist |
| 6,096,414 A | 8/2000 | Young |
| 6,195,267 B1 | 2/2001 | MacDonald, Jr. et al. |

OTHER PUBLICATIONS

Chomerics Ecoplate™ Metallic Conformal Coating Process (2002).

Chomerics Ecoplate™ Metallic Conformal Coating Process, Performance Data Ecoplate 5030 (2002).

Chomerics Ecoplate™ Metallic Conformal Coating Process, Technical Bulleting 5030. Applicants request the Examiner to consider this reference as prior art under 102(a), however, Applicants respectfully reserve the right to supplement this Information Disclosure Statement and take a contrary position should it be necessary.

Chomerics Press Release—New Metallic Conformal Coating Process Provides High Performance Lower–Cost EMI Shielding (Feb. 15, 2002).

Chomerics EMI Products, Ecoplate™ Metallic Conformal Coating Process—©2001.

EMI Shielding and Thermal Mangement—Today's Communication Networks Have Chomerics Written All Over Them (Jan. 2002).

* cited by examiner

THERMAL-SPRAYED METALLIC CONFORMAL COATINGS USED AS HEAT SPREADERS

CROSS-REFERENCE TO RELATED APPLICATIONS

This application is a continuation-in-part of U.S. application Ser. No. 10/137,229, filed May 1, 2002, now U.S. Pat. No. 6,763,576 entitled "Manufacture of Electronics Enclosure Having a Conformal Corrosion-Resistant Metallized Shielding Layer," which application claims the benefit of the filing date of U.S. Provisional Application Ser. No. 60/289,920, filed May 10, 2001, the disclosure of each of which is expressly incorporated herein by reference.

BACKGROUND OF THE INVENTION

The present invention relates broadly to enclosures, such as cases, cabinets, housings, or parts thereof such as doors or covers, for mobile, i.e., cellular telephone handsets and other electronic devices, and particularly to the manufacture of such enclosures as having a metallic conformal coating which may be used as a heat spreader.

Engineers involved in the design of portable and other electronic systems and devices, such as televisions, radios, computers, mobile, i.e., cellular telephone handsets, medical instruments, business machines, communications equipment, and the like, often face performance problems, as well as government and industrial regulations, concerning electromagnetic interference (EMI). As plastic-housed electronics continue to shrink in size and to run at higher clock speeds, the chances for EMI problems increase. Radio frequency (RF) and digital components, current carrying traces, wires, and other conductors are the typical sources of most EMI emissions. In some cases, the more "noisy" components can be moved away from sensitive areas. However, smaller devices and tightly packed boards minimize that opportunity in a great many systems.

Ultimately, most high-frequency systems require some form of EMI shielding at the enclosure level. These enclosures, which may be a case, cabinet, or housing, or a part thereof such as a door or cover, may be formed of a metal such as steel, aluminum, or magnesium, or alternatively, of a plastic or other polymeric material. While a metal housing is inherently an effective EMI barrier, plastic enclosure parts must be made electrically conductive in order to function as an EMI shield. This has typically been achieved by a conductive layer, such as a paint, metal-filled elastomer, or a metal foil or coating, which may be provided by fastening, laminating, lining, transferring, over-molding, spraying, dipping, cladding, plating, or metallizing, or otherwise which may be applied or deposited across the interior or exterior surfaces of the housing. Although each method may offer certain advantages to the designer, there is almost always a cost-performance tradeoff necessary in the selection. Such methods are further described in commonly-assigned of U.S. application Ser. No. 10/137,229, in commonly-assigned U.S. Pat. No. 5,566,055, in DE 19728839, U.S. Pat. Nos. 5,847,317; 5,811,050; 5,442,153; 5,180,639; 5,170,009; 5,150,282; 5,047,260; 4,714,623; and WO 00/29635; 99/43191; 99/40769; 98/54942; 98/47340; 97/26782, and in the following publications of the Chomerics Division of Parker Hannifin Corporation (Woburn, Mass.): "CHO-SHIELD® Conductive Compounds;" "CHO-SHIELD® EMI Shielding Covers," Technical Bulletin 22, (1996); "CHO-VER SHIELD™ EMI Shielding Plastic Cover with Molded Conductive Elastomeric Gasket," (1999); "CHO-SHIELD® 2052 Conductive Coating," Technical Bulletin 48, (2000); "CHO-SHIELD® 2054 Conductive Coating," Preliminary Product Data Sheet, (2000); "CHO-SHIELD® 2056 High Performance Conductive Coating," Preliminary Product Data Sheet; and Ecoplate™ Metallic Conformal Coating Process. The best of these methods will accommodate the deepest recesses in a plastic housing part, where the smallest discontinuity may provide a pathway for spurious emissions.

Managing heat also can be crucial to maintaining the reliability and extending the life of portable and other electronic devices. Numerous cooling solutions, including heat sinks, heat pipes and flexible metal or ceramic heat spreaders, are available for shunting away excess component heat. These solutions typically require a separate heat sink or spreader attached to the heat-generating components. For certain applications, however, a more preferred solution would eliminate the need for such separate heat sinks or spreader.

BROAD STATEMENT OF THE INVENTION

The present invention is directed to an enclosure, such as a case, housing, or a part thereof such as a housing half or cover, for mobile telephone handsets and other electronic devices. More particularly, the invention relates to a conformal metallic or "metallized" coating layer for such enclosures. In being both electrically-conductive and, it has been discovered, an effective heat conductor, such coating advantageously may be used to provide both electromagnetic interference (EMI) shielding and thermal management, i.e., heat spreading, for the device. That is, when employed as an EMI shield, such coating also may be used to provide heat spreading for the device and thereby may eliminate the need to provide a separate heat sink or spreader in addition to the EMI shield.

The coating may be applied by means of a thermal spray process to a surface of the enclosure or enclosure part. In an illustrative embodiment, the coating layer is formed by the electric arc spraying of a metal such as tin, copper, zinc, nickel, or an alloy thereof, onto the interior or other surface of a enclosure part which may be diecast, stamped, machined, or, typically, molded of a plastic material such as a polycarbonate (PC), acrylonitrile-butadiene-styrene (ABS), PC/ABS blend, polysulfone, acrylic, polyvinyl chloride (PVC), polyphenylene ether (PPE), polystyrene (PS), polyamide, nylon, polyolefin, or a copolymer or blend thereof. The coating layer so formed is self-adherent and conforms to ribs, wall, and other structures, irregularities, or discontinuities which may be formed enclosure part surface. An electrically-conductive gasket may be dispensed or molded onto the part as chemically-bonded or otherwise self-adhered to the coating layer. Alternatively, the gasket may be adhesively bonded onto the coating layer or mechanically fastened to the part over the coating layer.

As provided on the interior or other surface of the enclosure part, the coating layer may be disposed in thermal adjacency with the integrated circuit (IC) chips and other heat-generating electronic components on the printed circuit board (PCB) or boards of the device for the dissipation of the heat generated by these components. In this regard, a sheet, pad, or other layer of a thermally-conductive interface material may be used to fill the gaps between the coating layer and one or more of the components to provide a low thermal impedance path for the more efficient transfer of heat from the-components to the coating layer, which heat then may be dissipated across the surface area of the coating layer and enclosure part for the cooling of the device. Experiments have shown that such a metallic conformal coating layer, which may have a thickness of between about 0.5–100 mils (0.0125–2.5 mm), may be used to provide an EMI shielding effectiveness, i.e., attenuation, of 60 dB or more while lowering the temperature of the device by 30° C. or more.

The present invention, accordingly, comprises the articles and methods of manufacture possessing the construction, combination of elements, and arrangement of parts and steps which are exemplified in the detailed disclosure to follow. Advantages of the present invention include a conformal metallized coating layer which is both an effective heat conductor and EMI shield, and which may be formed reliably and economically on the surface of plastic housing or other enclosure of an electronic device by an electric arc thermal spray process. The coating film so formed is strongly adherent, has a low porosity and oxidation, and requires no curing or further processing. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein.

Figure 1:
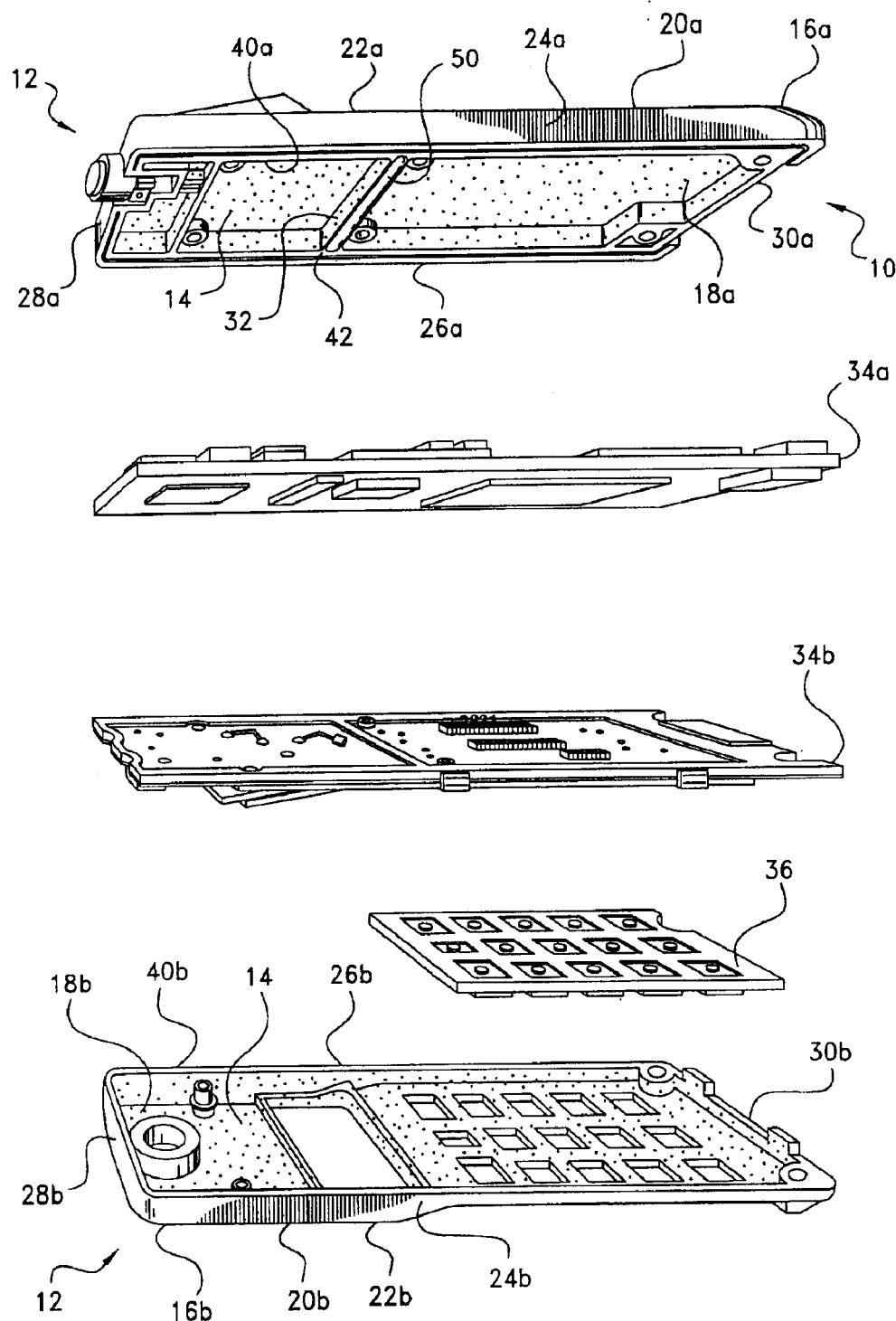
FIG. 1 is an exploded perspective end view of a handheld electronic communication device representative of a typical application for the enclosure herein involved.

The drawings will be described further in connection with the following Detailed Description of the Invention

DETAILED DESCRIPTION OF THE INVENTION

Certain terminology may be employed in the following description for convenience rather than for any limiting purpose. For example, the terms "forward" and "rearward," "front" and "rear," "right" and "left," "upper" and "lower," "top" and "bottom," and "right" and "left" designate directions in the drawings to which reference is made, with the terms "inward," "inner", "interior," or "inboard" and "outward," "outer," "exterior," or "outboard" referring, respectively, to directions toward and away from the center of the referenced element, the terms "radial" or "vertical" and "axial" or "horizontal" referring, respectively, to directions or planes perpendicular and parallel to the longitudinal central axis of the referenced element, and the terms "downstream" and "upstream" referring, respectively, to directions in and opposite that of fluid flow. Terminology of similar import other than the words specifically mentioned above likewise is to be considered as being used for purposes of convenience rather than in any limiting sense. Also as used herein, "state change" may be used interchangeably with "phase change" to avoid confusion with the description of separate material phases, such as a continuous and a dispersed phase, within a compound or layer thereof.

In the figures, elements having an alphanumeric designation may be referenced herein collectively or in the alternative, as will be apparent from context, by the numeric portion of the designation only. Further, the constituent parts of various elements in the figures may be designated with separate reference numerals which shall be understood to refer to that constituent part of the element and not the element as a whole. General references, along with references to spaces, surfaces, dimensions, and extents, may be designated with arrows.

For the illustrative purposes of the discourse to follow, the preparation of the conformal metallic coating of the invention herein involved is described in connection with electric arc thermal spray process. It should be appreciated, however, that other spray processes, such a flame spraying, utilizing alternative ignition sources, such as oxygen, propane, acetylene, natural gas, or other combustible gases, may also be employed. The use of these such other processes, as may be further described in WO 00/29635, therefore should be considered to be expressly within the scope of the present invention.

Referring then to the figures wherein corresponding reference characters are used to designate corresponding elements throughout the several views with equivalent elements being referenced with prime or sequential alphanumeric designations, an exemplary electronic device is shown generally at 10 in the exploded perspective view of FIG. 1 as including a case, housing, or enclosure, reference generally at 12, which is adapted in accordance with the precepts of the present invention as having a metallized conformal coating layer, 14. For purposes of illustration, device 10 is shown to be a mobile telephone handset, but alternatively may be another handheld, portable, or other electronic device such as a personal communications services (PCS) handset, PCMCIA card, modem, wireless communication base station, telemetry or telematic device, global positioning system (GPS), radio receiver, personal digital assistant (PDA), notebook or desktop personal computer (PC), cordless telephone handset, network router or server, medical electronic device, or the like. Enclosure 12 is shown to be of a 2-part construction including a back cover, 16*a*, and a front cover, 16*b*, each of the parts 16*a–b* having a corresponding interior surface, 18*a–b*, and an exterior surface, 20*a–b*, which extend coterminously to form adjoining back and front walls, 22*a–b*, side walls, 24*a–b* and 26*a–b*, and end walls, 28*a–b* and 30*a–b*. Typically, the interiors of one or both of the enclosure parts 16 are divided or partitioned, such as by the wall referenced at 32 for part 16*a*, into one or more separate cavities for providing electromagnetically isolated compartments for the circuitry of the device 10. As is shown, enclosure 12 may house one or more printed circuit boards (PCBs), 34*a–b*, or other circuitry or parts, such as a keypad, 36, of the device 10.

The interior surfaces 18 of the parts 16*a–b* also extend to define interface surfaces, 40*a–b*, about the perimeter of each of the enclosure parts 16, and also, as is referenced at 42 for wall 32, on the internal walls or other partition structures formed within the parts 16. The interface surfaces 40 and 42 are configured for abutting or other direct or indirect contact engagement with a mating interface surface of the other enclosure part 16, or with a corresponding interface or ground trace surface of a PCB 34 or other part of the device 10. A compressible gasket or other seal, a length of which is shown at 50 as bonded or otherwise supported on interface surface 42, may be interposed between the mating interface or ground trace surfaces. Depending upon the requirements of the application, gasket 50 may extend continuously or discontinuously over all or a portion of the interface surfaces 40 and 42 on one or both or the parts 16a–b. Typically, gasket 50 will be formed of a electrically-conductive material or composite material structure to provide electrical continuity and, optionally, environmental sealing between the mating parts.

Enclosure parts 16a–b, which may be formed of the same or different materials, may be diecast, stamped, or machined of a metal material such as aluminum, zinc, magnesium, steel, or a mixture or alloy thereof. Alternatively, for may handheld or portable applications, parts 16 may be injection molded, thermoformed, or otherwise formed of a plastic, which may be thermoplastic or thermoset, or other polymeric material such as a polycarbonate, acrylonitrile-butadiene-styrene, polysulfone, acrylic, polyvinyl chloride, polyphenylene ether, polystyrene, polyamide, nylon, polyolefin, poly(ether ether ketone), polyimide, polyetherimide, polybutylene terephthalate, polyethylene terephthalate, fluoropolymer, polyester, acetal, liquid crystal polymer, polymethylacrylate, polyurethane, polyphenylene oxide, polystyrene, epoxy, phenolic, or a copolymer or blend thereof.

As formed of a plastic material, the enclosure parts 16 will generally be non-electrically conductive, and coating layer 14 thus may be provided as an electrically-conductive and, preferably, corrosion-resistant surface on or both of the parts 16. As may be seen with additional reference to FIG. 2 wherein enclosure part 16a is shown in enhanced detail and to the magnified cross-sectional view thereof of FIG. 3, layer 14 may be characterized as an adherent, electrically-conductive film or other coating or the like which is applied to cover at least a portion of one or both of the interior surfaces 18a–b of the corresponding enclosure part 16a–b. For many applications, shielding layer 14 will have a film thickness, referenced at "t" in FIG. 3, of between about 0.5–100 mils (0.0125–2.5 mm), with the enclosure parts 16a–b having a thickness, referenced at "T" in FIG. 3 of between about 0.020–0.250 inch (0.05–1 cm).

In an illustrative embodiment, the metallized coating layer 14 is thermally-sprayed, such as by means of standard arc wire equipment, onto at least a portion of and, typically, substantiality the entirety of the interior surfaces 18 and interface surfaces 40 and 42 of each of the parts 16a–b. For corrosion resistance, layer 14 may be formed of tin, nickel, or an alloy thereof. Alternatively, layer 14 may be formed of copper, silver, zinc, or other metal or alloy. Typically, the composition of layer 14 may comprise between about 80–95% by weight of tin or nickel, and between about 5–20% by weight of one or more of zinc, copper, or aluminum. Trace amounts of other metals, elements, and organic or inorganic compounds also may be present. Such material is economical and provides a corrosion-resistant coating on surface 18. In this regard, layer 14 typically will exhibit a less than about 5–15% increase in surface resistance upon exposure to a salt-fog environment for about 48 hours at about 35° C. Layer 14 similarly will be observed to exhibit substantially no increase in surface resistance following a thermal cycling of at least about 5 cycles at −40° C. to 85° C. with a dwell time of about two hours at each of the upper and lower temperature limits.

Advantageously, as thermally-sprayed in accordance with the present invention, coating layer 14 is self-adherent to interior surface 18 as being bonded thereto. Such bond principally will be by way of mechanical forces, but additionally may include fusion or chemical bonding, and/or electrostatic, van der Waals, or other valance or attractive forces depending upon the composition and the compatibility of the metal or plastic material forming surface 18 and the metal material forming the metallized coating layer 14. Typically, layer 14 will be observed to have an assigned rating of about "5B," i.e., substantially no coating pickoff, as determined on a scale of 0B–5B in accordance with ASTM Test Method D3359-97, "Standard Test Methods for Measuring Adhesion by Tape Test," in which the adhesion of coatings is assessed by applying and removing pressure-sensitive tape over cross-hatch cuts made in the coating.

Prior to the metallizing of layer 14 thereon, surface 18 may be cleaned, etched, roughened, or otherwise treated or modified such as by means of one or more of compressed gas, chemical or solvent etching/cleaning, grit-blasting, such as with aluminum oxide or another abrasive, or other known surface treatment such as corona discharge or plasma ionization. Alternatively, a chemical bond coat, such as a thermoplastic dissolved in a solvent, may be applied to the surface 18 and dried or otherwise cured thereon to form an intermediate tie layer between the surface and the metallized layer 14.

As an addition or an alternative to the above-described surface treatments, the metallizing may be effected at an elevated substrate temperature, such as 50° C. or higher, so as to increase the surface energy of the surface 18. However, the metallizing also may be performed at ambient temperature so as to avoid any potential for heat distortion and other dimensional, physical, or chemical changes in the substrate material. Depending upon the requirements of the particular application involved, areas of surface 18 may be masked, such as by means of a overlay cut-out, to prevent the deposition of shielding layer 14 on those areas. As mentioned, and as may be seen best in the cross-sectional view of FIG. 3, the coating layer 14 formed in accordance with the present invention is conformal in that it is able to cover ribs, stiffeners, bosses, deep draws, vertices, and other surface asperities, irregularities, or discontinuities, such as the generally vertical surfaces 60a–b of wall 32.

Figure 3:
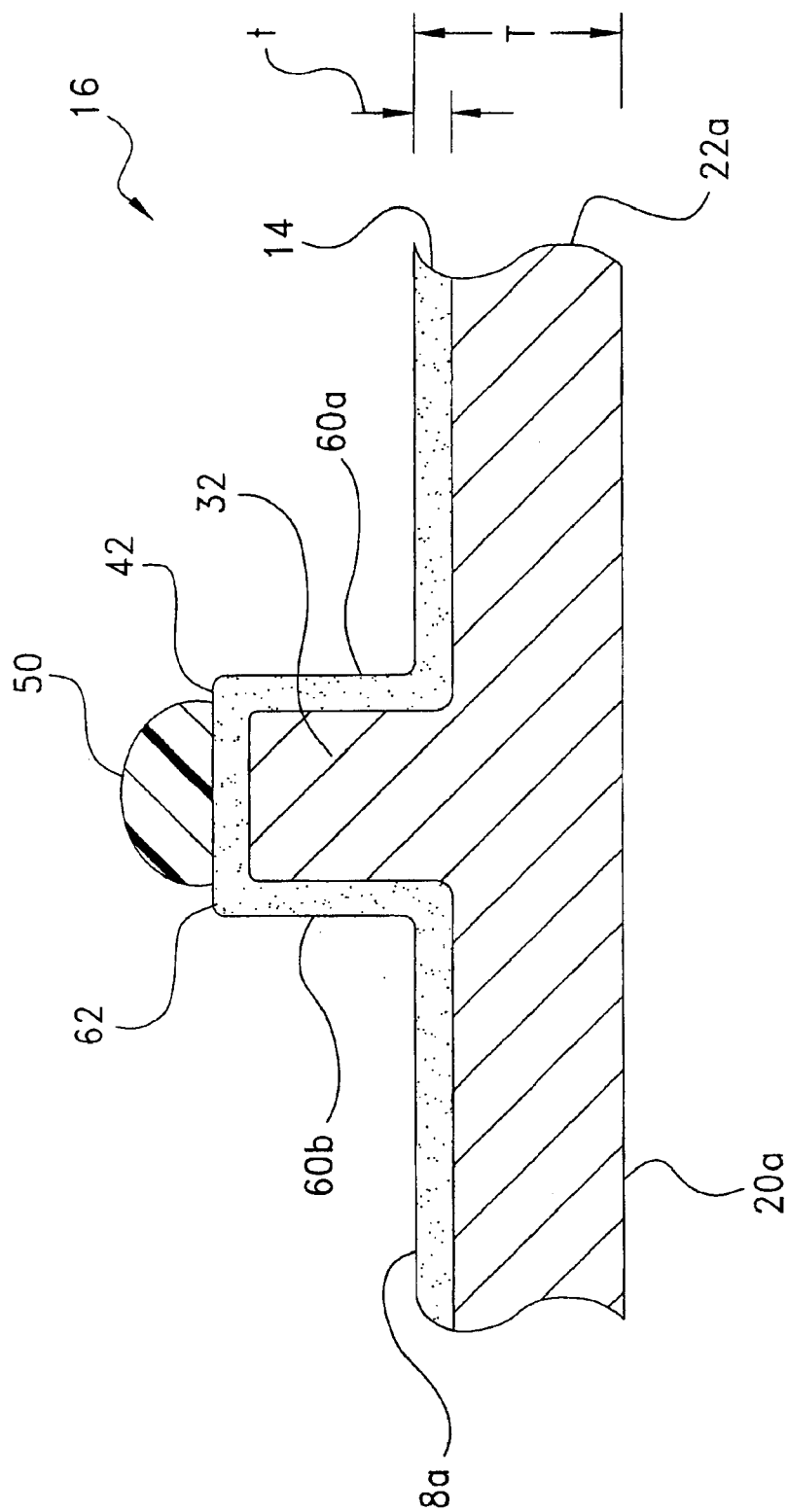
FIG. 3 is a cross-sectional view of the enclosure part of FIG. 2 taken through line 3—3 of FIG. 2.

With continuing reference to FIG. 3, gasket 50 may be seen to be disposed following the metallization of surface 18 on the portion 62 of layer 14 covering the interface surface 42. Such gasket 50 may be provided as having a resilient core element affording gap-filling capabilities which is either loaded, sheathed, or coated with an electrically conductive element. The resilient core element, which may be foamed or unfoamed, solid or tubular, typically is molded, extruded, die-cut, or otherwise formed of an elastomeric thermoplastic material such as a polyolefin, polyvinyl chloride, or a polypropylene-EPDM blend, or a thermoplastic or thermosetting rubber such as a butadiene, styrene-butadiene, nitrile, chlorosulfonate, neoprene, urethane, silicone, or fluorosilicone.

Conductive materials for the filler, sheathing, or coating include metal or metal-plated particles, fabrics, meshes, and fibers. Preferred metals include copper, nickel, silver, aluminum, tin or an alloy such as Monel, with preferred fibers and fabrics including natural or synthetic fibers such as cotton, wool, silk, cellulose, polyester, polyamide, nylon, polyimide. Other conductive particles and fibers such as carbon, graphite, plated glass, or a conductive polymer material may be substituted. The gasket, alternatively, may be provided to be of an all-metal, knitted wire construction, or as a over-molded or formed-in-place (FIP) bead of a curable, electrically-conductive silicone or urethane composition. As to an FIP construction, the composition is dispensed in a fluent state onto the surface 42 and the layer 14 portion 62 thereon, then is cured or foamed in situ via the application of heat or with atmospheric moisture, UV, radiation, or other energy sources.

Means of securing gasket 50 to the layer portion 62 include pressure-sensitive adhesive tapes or other layers (not shown), which may be filled to be electrically conductive, interposed between the layer 14 portion 62 and the gasket. Alternatively, mechanical means of attachment such as clips, fasteners, or a tongue-in-groove or other interference fit may be employed. In the case of an over-molded or FIP construction, the gasket 50 may be self-bonded by chemical, mechanical, or other adhesive forces to the layer 14 portion 62. EMI shielding gaskets and their methods of manufacture and use are further described in U.S. Pat. Nos. 6,121,545; 6,096,413; 5,910,524; 5,882,729; 5,731,541; 5,641,438; 5,603,514; 5,578,790; 5,566,055; 5,524,908; 5,522,602; 5,512,709; 5,438,423; 5,202,536; 5,142,101; 5,115,104; 5,107,070; 5,105,056; 5,068,493; 5,028,739; 5,008,485; 4,988,550; 4,968,854; 4,952,448; 4,857,668; and 3,758,123, and in WO 96/22672 and 98/54942; Japanese Patent Publication (Kokai) No. 7177/1993; DE 19728839, and Severinsen, J., "Gaskets That Block EMI," Machine Design, Vol. 47, No. 19, pp. 74–77 (Aug. 7, 1975).

Figure 4:
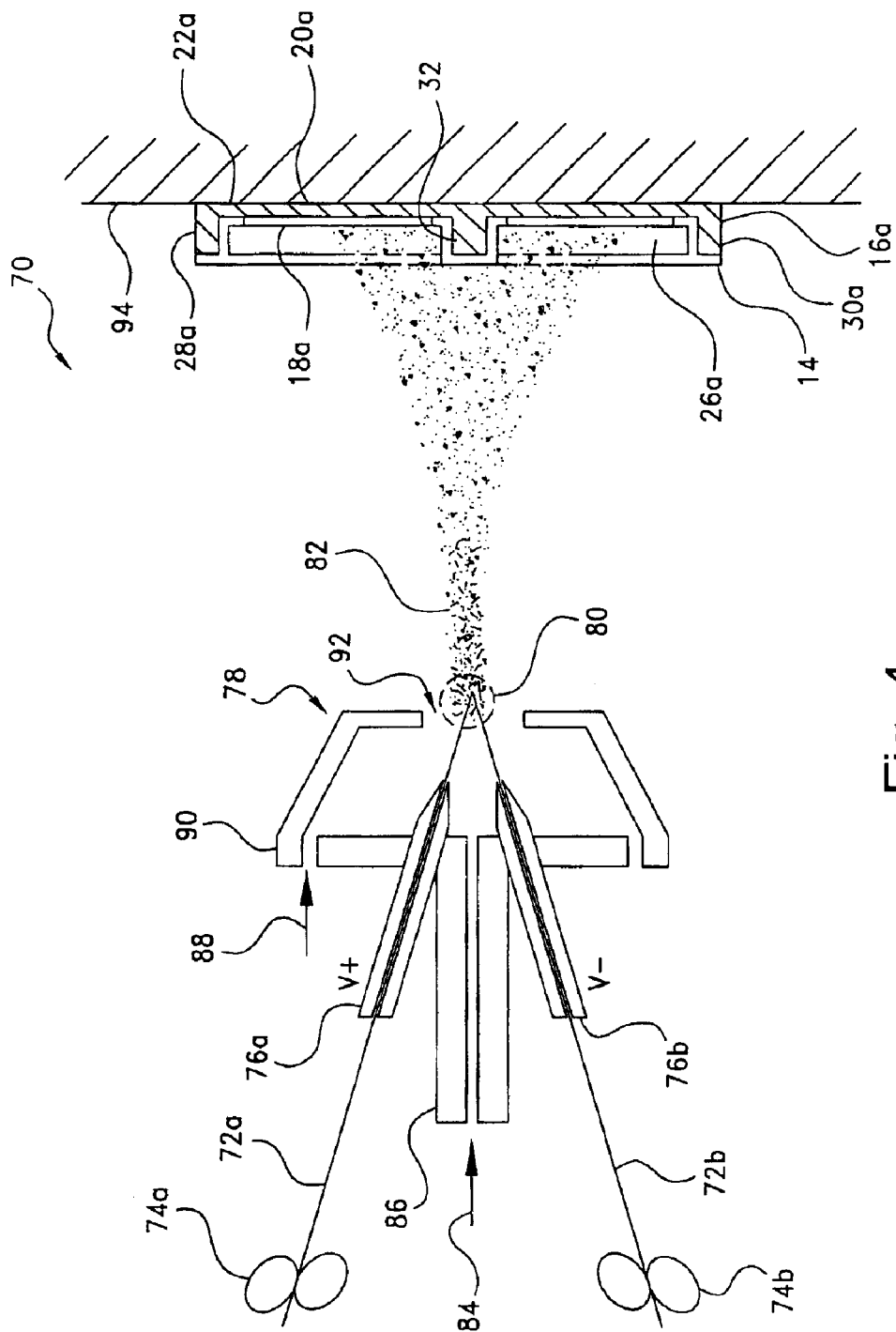
FIG. 4 is a schematic plan view of a representative electric arc thermal spray system for forming the metallized conformal coating layer of FIGS. 2 and 3.

Turning next to FIG. 4, a schematic diagram of a representative arc wire system adapted for the thermal spraying of shielding layer 14 onto interior surface 18a of enclosure part 16a is referenced generally at 70. In the system 70, a pair of electrically-conductive, consumable wire electrodes, 72a–b, are feed via a corresponding roller arrangement, 74a–b, or other mechanism through a pair of contact tubes, 76a–b, which may be housed within a nozzle, referenced generally at 78, of a gun or other spray head. Each of the wire electrodes 72, which may be of the same or difference composition, may be provided in accordance with the present invention as formed of the tin, nickel, or alloy metal further described hereinbefore. The wire sizes and feed rates may be varied depending on the application, but generally would be considered conventional for the arc wire process herein involved.

With one of the contact tubes 76a–b being held, for example, at a positive voltage potential, such as is referenced at $V_+$, and with the other of tubes 76a–b being held at a negative voltage potential, such as is referenced at $V_-$, a corresponding electrical potential difference may be induced in the wire electrodes 72 by virtue of their conductive contact with an associated on of the tubes 76. Such potential difference is manifested as an electric arc which is generated within a gap or "arc zone," located generally in the area referenced at 80, maintained between the tips of the wires 72. As the wires 72 are feed continuously into the arc zone, heat generated resistively by the arc raises the temperature of the wires to above their corresponding liquidus temperature, typically between about 200–500° C., and thereby causes the tips of the wires to melt. The melt produced is atomized into a spray, 82, of droplets by a primary gas stream, the direction of which is denoted by the arrow 84, which stream 84 may be compressed air supplied into the arc zone 80 through a centrally-located tube or other passageway, 86. Additional atomization or containment of the spray 82 may be effected by a secondary gas stream, the direction of which is denoted by the 88, which stream 88 my be introduced within a shield, 90, which surrounds the orifice or outlet, 92, of the nozzle 78.

Figure 2:
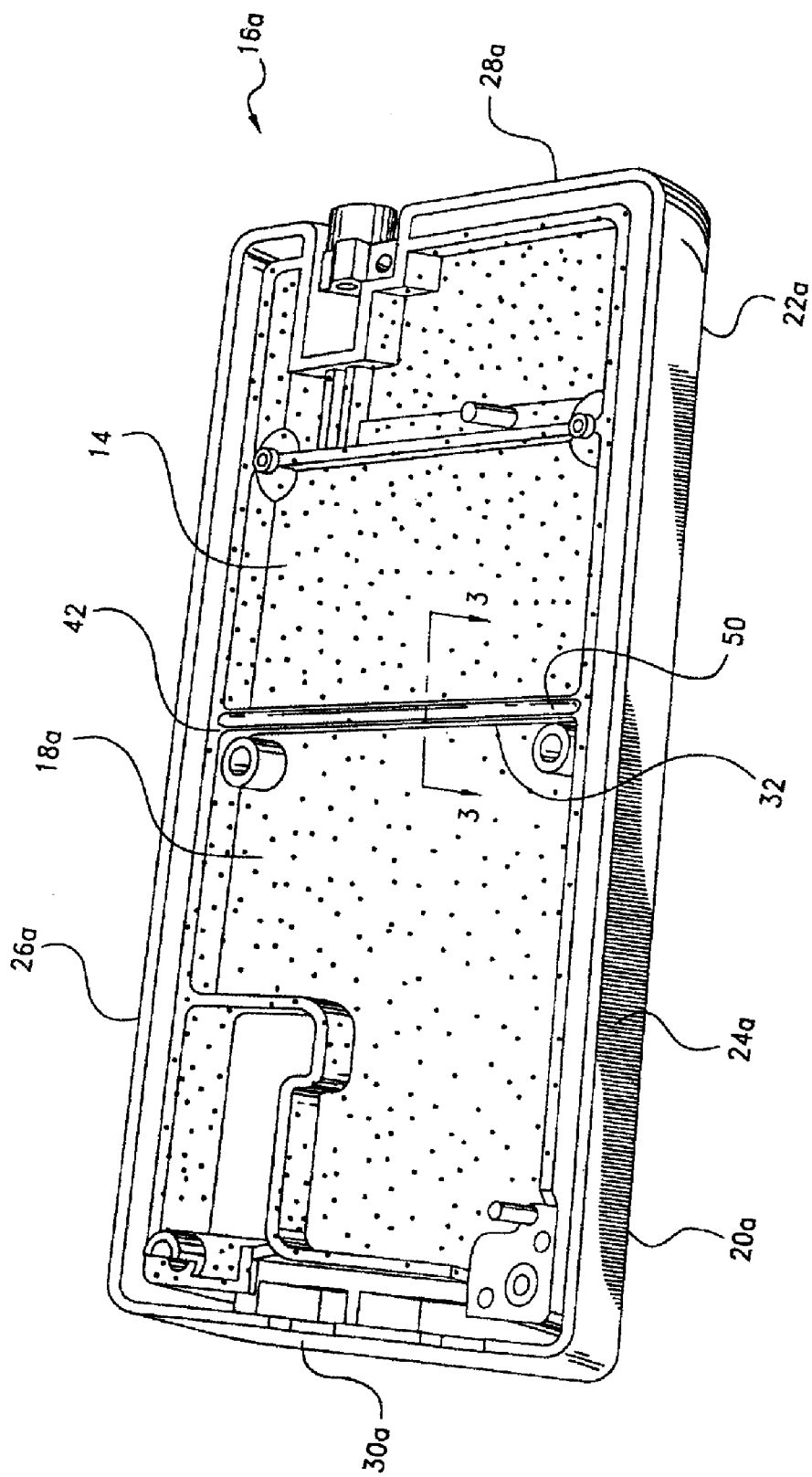
FIG. 2 is a perspective view of a back cover of the enclosure of FIG. 1 showing the interior surface thereof as having a thermal spray-applied conformal metallized coating layer in accordance with the present invention.

The force of the atomizing gas streams 84 and 88 also accelerates the droplets of the spray 82 towards the workpiece, represented in FIG. 4 by the housing part 16a of FIGS. 1–3, which may be positioned a spaced-apart distance, typically between about 4–24 inches (10–60 cm), opposite the nozzle 78 as received on a table, conveyor, or other support, 94. As is known, one or both of the nozzle 78 or workpiece 16a may be moved relative to other to provide complete coverage of the substrate surface 18 by the spray 82. For example, the nozzle 78 may be mounted for movement along one or more axes on a gantry or an articulated robotic arm. The molten droplets of spray 82 solidify and fuse rapidly upon impact with the surface 18 to form an adherent coating of the shielding layer 14 of the invention thereon. Depending upon the thickness of the layer 14 required, single or multiple passes of the spray 82 over the surface 18 may be performed.

Figure 5:
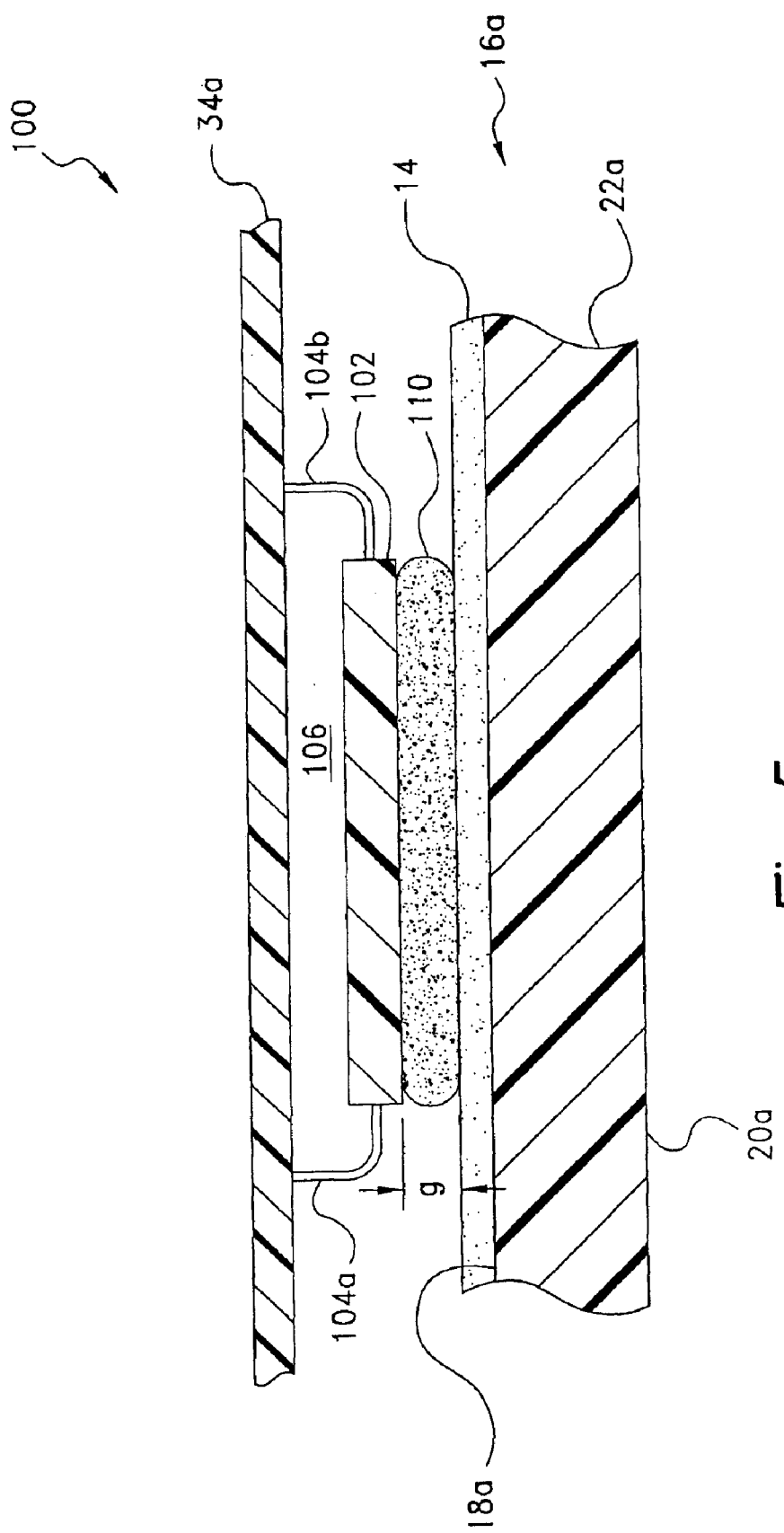
FIG. 5 is an enlarged cross-sectional, fragmentary assembly view showing a representative EMI shielding and thermal management assembly in accordance with the present invention wherein a cover or other enclosure part as in FIGS. 2–3 is disposed in heat transfer adjacency with a heat-generating electronic component with the gap therebetween being filled with a thermal interface material.

Referring lastly to FIG. 5, a representative EMI shielding and thermal management assembly in accordance with the present invention is referenced generally at 100. In the assembly 100, a housing half, cover, or other enclosure part, such as part 16a as in FIGS. 1–4 having the layer 14 formed as described hereinbefore or otherwise as provided, is disposed in the assembled device 10 (see FIG. 1) in confronting or other heat transfer adjacency with one or more of the heat-generating analog, digital, or other electronic components, such as the component referenced at 102, supported on the PCB 34a or other substrate within the device 10.

Component 102 may be an integrated microchip, microprocessor, transistor, or other power semiconductor device, an ohmic or other heat-generating subassembly such as a diode, relay, resistor, transformer, amplifier, diac, or capacitor, or, alternatively, another heat-generating source, and typically, component 58 will have an operating temperature range of between about 60–100° C. For the electrical connection of component 102 to PCB 34a, one or more pairs of solder balls, leads, or pins, one pair of which is referenced at 104a–b, are provided as extending from component 102 into a soldered or other connection with PCB 34a. Leads 104 additionally may support, as is shown, component 104 above PCB 34a to define a gap, referenced at 106, of about 3 mils (75 microns) therebetween. Alternatively, component 102 may be received directly on PCB 34a.

With the part 16a having the applied layer 14 being disposed as shown in opposition or like thermal adjacency one or more of the components 102, a gap, referenced at "g," is defined therebetween the layer and one or more, or each, of the components 102 which may range, for example, from about 2 mils (0.05 mm), or less, to about 100 mils (2.5 mm), or more. For at least partially filling the gap g to provide a lower thermal impedance path for the more efficient transfer of heat from one or more, or each, of the components 102 to the coating layer 14, which heat then may be dissipated across the surface area of the layer 14 and enclosure part 16a for the cooling of the device 10 (FIG. 1), a sheet, pad, or other layer, 110, of a thermal interface material may be interposed or, such as in the case of a form-in-pace compound, dispensed between one or more, or each, of the components 102 and the layer 14.

Such material forming layer 110 may be an admixture of a filler and a resin. The filler generally may be thermally-conductive as having a thermal conductivity of at least about 20 W/m-K, and may comprise oxide, nitride, carbide, diboride, graphite, or metal particles, or a mixture thereof. The resin, which may be a homopolymer, copolymer, or blend, may comprise an elastomer such as a silicone or polyurethane, or a phase-change material (PCM). Formulated as described, the admixed material may have a thermal conductivity, such as in accordance with ASTM D5470, of at least about 0.5 W/m-K.

Within the gap g, the material generally may conform, such as under an applied pressure developed by the mating of the housing parts 16a–b, to at least partially fill the gap g. Depending upon the requirements of the particular application, the material 110 may be selected to be conformable or otherwise compliant under a relative low or substantially no force, that is, for example, a compression or force deflection of about 25% at about 0.3 psi (2 kPa), and of about 50% at about 1 psi (6 kPa) or less. Thermal interface materials are further described in U.S. Pat. Nos. 6,096,414; 6,054,198; 5,798,171; 5,766,740; 5,679,457; 5,545,473; 5,533,256; 5,510,174; 5,471,027; 5,359,768; 5,321,582; 5,309,320; 5,298,791; 5,250,209; 5,213,868; 5,194,480; 5,137,959; 5,167,851; 5,151,777; 5,060,114; 4,979,074; 4,974,119; 4,965,699; 4,869,954; 4,842,911; 4,782,893; 4,764,845; 4,685,987; 4,654,754; 4,606,962; 4,602,678; 4,473,113; 4,466,483; 4,299,715; and 3,928,907. Additional thermal interface material also may be used to fill the gap 106.

Particularly as employed within the EMI shielding and thermal management assembly 100, coating layer 14 may be formed so as to exhibit an electrical surface resistance of not greater than about 0.10 Ω/sq., and to provide an EMI shielding effectiveness, such as in accordance with CHO-TM-TP08 TP57 (Chomerics Test Procedure, Parker Chomerics Division, Woburn, Mass.), of at least about 60 dB substantially over a frequency range of between about 10 MHz and about 2 GHz. Such layer 14, moreover, may be so formed as to exhibit a thermal conductivity, such as in accordance with ASTM D5470, of at least about 5 W/m-K.

Although, as mentioned, and particularly for corrosion resistance, layer 14 may be formed of tin, nickel, or an alloy thereof, the layer alternatively may be formed of another metal or alloy, such as copper, having a relatively higher thermal conductivity and thereby allowing for a reduction in the film thickness of the coating layer while affording comparable thermal performance.

Although the coating layer 14 is shown in FIG. 5 to be generally homogeneous, a composite, i.e., laminate, arrangement of two or more layers of different materials, one deposited on top of the other, also may be used. For example, a first of such layers, which may be an inner or outer layer, may be more, or less, thermally conductive than a second of such layers which, in turn, may be more or less corrosion-resistant, or more or less adherent to the surface 18a, than the first layer. A specific example would be the deposition of tin-zinc alloy layer on top of an inner copper alloy layer for the purpose of protecting the copper from oxidation.

Furthermore, although the coating layer 14 also is shown in the figures herein to cover the entirety, or substantially the entirety of the surface 18a, it should be appreciated that the layer 14 may be deposited in a specific pattern so as to function as a "heat pipe."

In such an arrangement, the heat transferred from the component 102 may be channelled along a path defined by the coating pattern to a specified point or member, such as a heat sink, for dissipation.

Thus, the use of thermal-sprayed or otherwise deposited metal and metal alloys as conformal coating or other covering layers on the surfaces of enclosures, enclosure parts, and the like have been described. Such layers may be used within assemblies such as electronic devices to provide either or, advantageously, both EMI shielding and thermal management for the device, and without the need to provide a separate heat sink or spreader, i.e., in addition to the EMI shield.

The Example to follow, wherein all percentages and proportions are by weight unless otherwise expressly indicated, is illustrative of the practicing of the invention herein involved, but should not be construed in any limiting sense.

EXAMPLE

Representative coating samples according to the present invention were prepared for characterization using an electric-arc thermal spray process. Individual panels of a 0.125 inch (3.175 mm) thick acrylonitrile-butadiene-styrene (ABS) sheet, representative of a plastic housing or case, were coated with a 1.5, 4.0, 11.0 or 17.3 mil (0.04, 0.10, 0.28, or 0.44 mm) thick layer of an 80% Sn, 20% Zn alloy. The coated sheets were cut into 2×2 inch (5×5 cm) panels for testing.

In each test, a Type "T" thermocouple was attached with thermally conductive adhesive tape to the center of the uncoated surface of each of the test panels to measure "skin" temperature. A 0.75×0.75 inch (1.9×1.9 cm) pad of a 0.07 inch (1.78 mm) thick thermally-conductive thermal interface material was interposed between a heat source and the panel. The pad, which included a layer of aluminum foil on one side, was attached to the center of the test panel with the foil surface adjacent the coating layer side of the panel. The heat source, a TIP31 power semiconductor device in a TO220 package, was attached through its base to the other (elastomer) surface of the pad. It was noted that the elastomer surface of the pad was sufficiently tacky to maintain thermal contact with the device throughout the test.

The TIP31 device was connected to an Analysis Tech Phase 10 Thermal Analyzer to power the device and perform the temperature measurements. Device junction, ambient and plastic and plastic case temperatures were recorded upon thermal equilibrium being established. Thermal resistance (R) values also were determined. The results are summarized in the table below.

TABLE

| Thickness (mils) | Power (watts) | $T_{junction}$ (° C.) | $T_{case}$ (° C.) | $T_{ambient}$ (° C.) | $R_{junction\text{-}case}$ (° C./W) | $R_{junction\text{-}ambient}$ (° C./W) |
|---|---|---|---|---|---|---|
| 0 | 2.02 | 110.8 | 74.6 | 22.2 | 17.8 | 43.8 |
| 1.5 | 2.02 | 103.7 | 67.3 | 21.2 | 18.0 | 40.7 |
| 4.0 | 2.02 | 94.5 | 60.2 | 21.8 | 17.0 | 35.9 |
| 11.0 | 2.02 | 86.8 | 54.0 | 20.9 | 16.2 | 32.5 |
| 17.3 | 2.02 | 81.3 | 48.0 | 22.1 | 16.4 | 29.2 |

These data show that the metallic conformal coating of the present invention, in layers as thin as 1.5 (0.04) mil or less, is effective to dissipate the heat generated by a semiconductor device, and to reduce the overall heat load that the plastic case must dissipate into the environment. Such thermal dissipation performance reduces the junction temperature of the device as well as the potential for hot spots on the case. Indeed, the result for the 4.0 mil (0.10 mm) thick coating sample is especially significant effect insofar as the junction temperature was reduced by 15° C. and the case temperature was reduced to 60° C. Such a reduction in the case temperature is of practical importance as a case temperature over 60° C. can cause burns when touched.

As it is anticipated that certain changes may be made in the present invention without departing from the precepts herein involved, it is intended that all matter contained in the foregoing description shall be interpreted in as illustrative rather than in a limiting sense. All references including any and all priority documents cited herein are expressly incorporated by reference.

What is claimed is:

1. A method of dissipating heat from an electronic device having an enclosure and at least one heat-generating source received within the enclosure, the enclosure having one or more parts, and at least one of the parts having an exterior surface and an opposing interior surface, the method comprising the steps of:
   (a) covering at least a portion of the interior surface of said one of the enclosure parts with a conformal metallic layer by the steps of:
      (i) providing a feed material comprising a metal or metal alloy;
      (ii) heating said feed material of step (i) into a molten state;
      (iii) atomizing said feed material of step (ii) while in said molten state;
      (iv) spraying the atomized feed material of step (ii) while in said molten state on said portion of the interior surface of said one of the enclosure part to form a self-adherent coating of said metal thereon; and
      (v) solidifying said coating of step (iii) to form said conformal metallic layer; and
   (b) disposing the conformal metallic layer covered on said one of the enclosure parts and the source in heat transfer adjacency with each other.

2. The method of claim 1 wherein the metallic layer comprises tin, nickel, copper, zinc, aluminum, silver, or an alloy thereof.

3. The method of claim 1 wherein said feed material is heated in step (a)(ii) by generating an electric arc within an arc zone, and passing said feed material through said arc zone.

4. The method of claim 3 wherein:
   said feed material is atomized in step (a)(iii) by a gas stream passed with said feed material through said arc zone; and
   said feed material is sprayed in step (a)(iv) by entrainment within said gas stream.

5. The method of claim 3 wherein:
   said feed material is provided as a first wire and a second wire, each said wire being passed with the other said wire through said arc zone; and
   wherein said arc is generated by applying an electrical potential difference between said first and said second wire.

6. A method of dissipating heat from an electronic device having an enclosure and at least one heat-generating source received within the enclosure, the enclosure having one or more parts, and at least one of the parts having an exterior surface and an opposing interior surface, the method comprising the steps of:
   (a) covering at least a portion of the interior surface of said one of the enclosure parts with a conformal metallic layer; and
   (b) disposing the conformal metallic layer covered on said one of the enclosure parts and the source in heat transfer adjacency with each other such that a gap is defined between the conformal metallic layer and the source,
   wherein before or after step (b), a thermal interface material is interposed between the conformal metallic layer covered on said one the enclosure parts and the source, said thermal interface material at least partially filling said gap.

7. The method of claim 6 wherein the thermal interface material comprises an admixture of a resin and a filler.

8. The method of claim 6 wherein said housing part is formed of a plastic.

9. The method of claim 8 wherein said plastic is polycarbonate, acrylonitrile-butadiene-styrene, polysulfone, acrylic, polyvinyl chloride, polyphenylene ether, polystyrene, polyamide, nylon, polyolefin, poly(ether ether ketone), polyimide, polyetherimide, polybutylene terephthalate, polyethylene terephthalate, fluoropolymer, polyester, acetal, liquid crystal polymer, polymethylacrylate, polyurethane, polyphenylene oxide, polystyrene, epoxy, phenolic, or a copolymer or blend thereof.

10. The method of claim 6 wherein the metallic layer has a thermal conductivity of at least about 5 W/m-K.

11. The method of claim 6 wherein the metallic layer exhibits an EMI shielding effectiveness of at least about 60 dB substantially over a frequency range of between about 10 MHz and about 2 GHz.

12. The method of claim 6 wherein the metallic layer has an electrical surface resistance of not greater than about 0.10 Ω/sq.

13. The method of claim 6 wherein said shielding layer of step (e) has a thickness of between about 0.5–100 mils (0.0125–2.5 mm).

14. The method of claim 6 where the heat-generating source is an electronic component.

15. The method of claim 14 where the electronic component is mounted on a circuit board.

16. A thermal management assembly for an electronic device having an enclosure and at least one heat-generating source received within the enclosure, the enclosure having one or more parts, and at least one of the parts having an exterior surface and an opposing interior surface, the assembly comprising:
   a conformal metallic layer covering at least a portion of the interior surface of said one of the enclosure parts, and the layer being disposed in heat transfer adjacency with the source received within the enclosure to define a gap therebetween; and
   a thermal interface material interposed between the conformal metallic layer and the source, said thermal interface material at least partially filling said gap.

17. The assembly of claim 1 wherein the metallic layer has an electrical surface resistance of not greater than about 0.10 Ω/sq.

18. The assembly of claim 16 wherein the metallic layer comprises a self-adherent coating of a metal or metal alloy.

19. The assembly of claim 18 wherein the metallic layer comprises tin, nickel, copper, zinc, aluminum, silver, or an alloy thereof.

20. The assembly of claim 1 wherein said shielding layer of step (e) has a thickness of between about 0.5–100 mils (0.0125–2.5 mm).

21. The assembly of claim 1 which consists for the source essentially of the conformal metallic layer and the thermal interface material.

22. The assembly of claim 1 wherein the thermal interface material comprises an admixture of a resin and a filler.

23. The assembly of claim 1 where the heat-generating source is an electronic component.

24. The assembly of claim 23 where the electronic component is mounted on a circuit board.

25. The assembly of claim 1 wherein said housing part is formed of a plastic.

26. The assembly of claim 25 wherein said plastic is polycarbonate, acrylonitrile-butadiene-styrene, polysulfone, acrylic, polyvinyl chloride, polyphenylene ether, polystyrene, polyamide, nylon, polyolefin, poly(ether ether ketone), polyimide, polyetherimide, polybutylene terephthalate, polyethylene terephthalate, fluoropolymer, polyester, acetal, liquid crystal polymer, polymethylacrylate, polyurethane, polyphenylene oxide, polystyrene, epoxy, phenolic, or a copolymer or blend thereof.

27. The assembly of claim 1 wherein the metallic layer has a thermal conductivity of at least about 5 W/m-K.

28. The assembly of claim 1 wherein the metallic layer exhibits an EMI shielding effectiveness of at least about 60 dB substantially over a frequency range of between about 10 MHz and about 2 GHz.

* * * * *